(12) United States Patent
Yoo et al.

(10) Patent No.: US 10,304,805 B2
(45) Date of Patent: May 28, 2019

(54) DUAL SIDED FAN-OUT PACKAGE HAVING LOW WARPAGE ACROSS ALL TEMPERATURES

(71) Applicant: Micron Technology, Inc., Boise, ID (US)

(72) Inventors: Chan H. Yoo, Boise, ID (US); Mark E. Tuttle, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/686,024

(22) Filed: Aug. 24, 2017

(65) Prior Publication Data

US 2019/0067247 A1 Feb. 28, 2019

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06513* (2013.01); *H01L 2225/06548* (2013.01); *H01L 2225/06558* (2013.01); *H01L 2225/06572* (2013.01); *H01L 2225/06586* (2013.01)

(58) Field of Classification Search
None
See application file for complete search history.

(56) References Cited

U.S. PATENT DOCUMENTS

| 2015/0001713 | A1 | 1/2015 | Goetz et al. |
| 2015/0221586 | A1* | 8/2015 | Paek ................. H01L 23/49816 257/668 |
| 2016/0300813 | A1 | 10/2016 | Zhai et al. |
| 2016/0307872 | A1 | 10/2016 | Chen et al. |
| 2016/0322330 | A1 | 11/2016 | Lin et al. |
| 2017/0098629 | A1 | 4/2017 | Liu et al. |
| 2018/0151501 | A1* | 5/2018 | Yu ........................ H01L 23/3114 |

FOREIGN PATENT DOCUMENTS

KR 20160129687 A 11/2016

OTHER PUBLICATIONS

International Application No. PCT/US2018/042441—International Search Report and Written Opinion, dated Oct. 30, 2018, 14 pages.

* cited by examiner

*Primary Examiner* — Mounir S Amer
(74) *Attorney, Agent, or Firm* — Perkins Coie LLP

(57) ABSTRACT

Semiconductor devices including a dual-sided redistribution structure and having low-warpage across all temperatures and associated systems and methods are disclosed herein. In one embodiment, a semiconductor device includes a first semiconductor die electrically coupled to a first side of a redistribution structure and a second semiconductor die electrically coupled to a second side of the redistribution structure opposite the first side. The semiconductor device also includes a first molded material on the first side, a second molded material on the second side, and conductive columns electrically coupled to the first side and extending through the first molded material. The first and second molded materials can have the same volume and/or coefficients of thermal expansion to inhibit warpage of the semiconductor device.

18 Claims, 7 Drawing Sheets

DUAL SIDED FAN-OUT PACKAGE HAVING LOW WARPAGE ACROSS ALL TEMPERATURES

TECHNICAL FIELD

The present disclosure generally relates to semiconductor devices. In particular, the present technology relates to semiconductor devices including a dual-sided redistribution structure and configured for low warpage across a wide range of device temperatures, as well as associated systems and methods.

BACKGROUND

Microelectronic devices generally have a semiconductor die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, dies are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

Different types of semiconductor dies may have widely different bond pad arrangements, and yet should be compatible with similar external devices. Accordingly, existing packaging techniques can include attaching a redistribution layer (RDL) to a semiconductor die. The RDL includes lines and/or vias that connect the die bond pads with RDL bond pads. An array of leads, ball-pads, or other types of electrical terminals of the RDL bond pads are arranged to mate with the bond pads of external devices. In one typical "Chip First" packaging process, a die is mounted on a carrier and encapsulated. The carrier is then removed and an RDL is subsequently formed directly on a front side of the die where the die bond pads are located using deposition and lithography techniques. In another typical "Chip Last" packaging process, an RDL is formed apart from a die and then the die is subsequently mounted to the RDL and encapsulated. However, one drawback of both Chip First and Chip Last packaging processes is that the resulting package is subject to warpage.

DETAILED DESCRIPTION

Specific details of several embodiments of semiconductor devices are described below. One aspect of several embodiments of the present technology is that semiconductor dies are at both sides of an RDL. Such symmetry is expected to mitigate warpage compared to devices formed using Chip First and Chip Last processes. More specifically, packages formed using Chip First and Chip Last processes have different layers on each side of the RDL. Such packages are susceptible to warpage in response to changing temperatures because the RDL, the semiconductor die, and the encapsulant can have different coefficients of thermal expansion. Excessive warpage can cause the package to malfunction and reduce the yield. Several embodiments of semiconductor devices in accordance with the present technology mitigate warpage.

In some embodiments, a semiconductor device includes a first semiconductor die electrically coupled to a first side of a redistribution structure, a second semiconductor die electrically coupled to a second side of the redistribution structure, a first molded material on the first side, and a second molded material on the second side. In some embodiments, the semiconductor device includes conductive columns extending away from conductive contacts on at least the first side of the redistribution structure and through the molded material. In certain embodiments, the first and second semiconductor dies are symmetric about the redistribution structure and the first molded material is the same as or has similar characteristics to the second molded material. In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
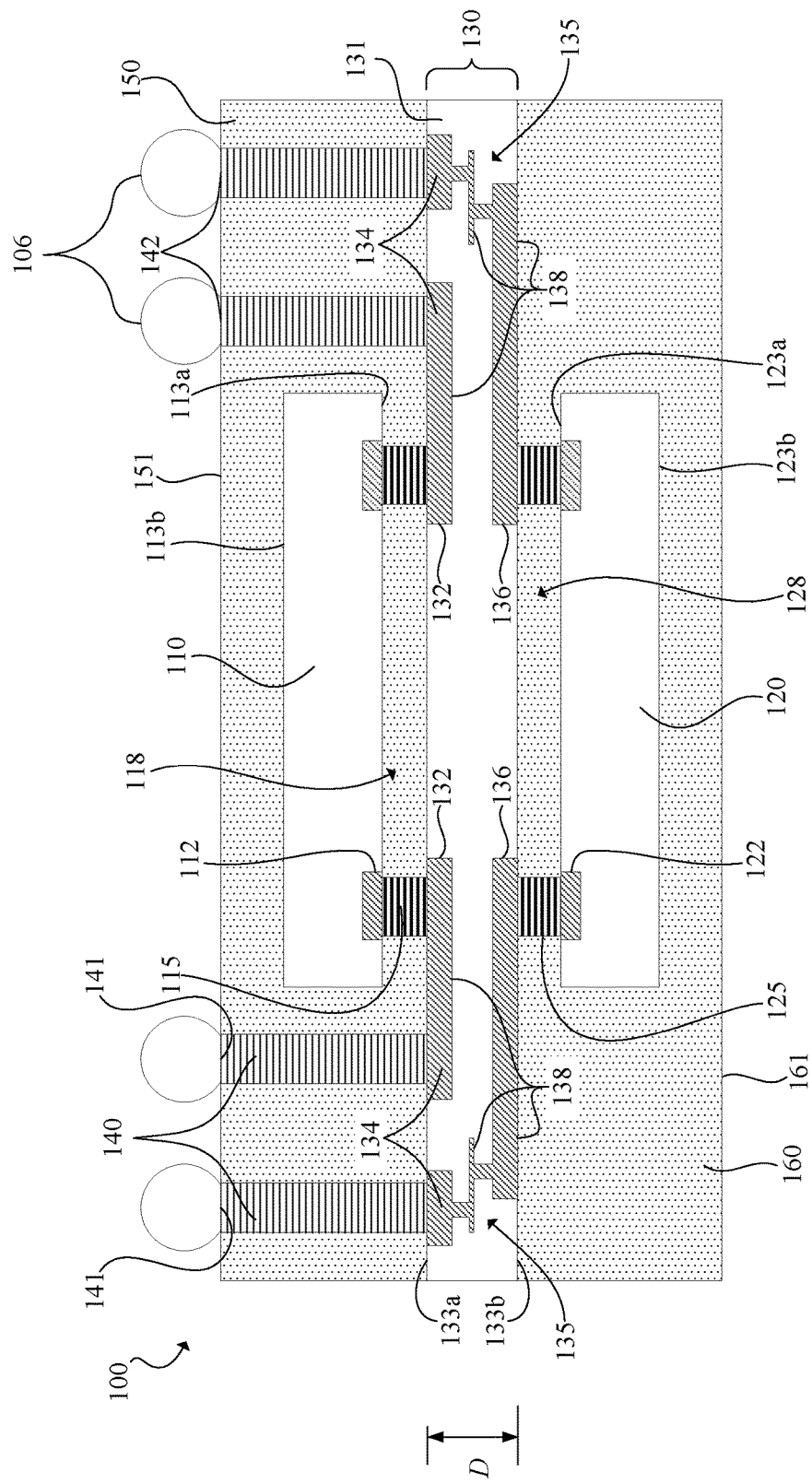
FIGS. 1A and 1B are a cross-sectional view and a top plan view, respectively, illustrating a semiconductor device in accordance with embodiments of the present technology.

FIG. 1A is a cross-sectional view illustrating a semiconductor device 100 ("device 100") configured in accordance with an embodiment of the present technology. The device 100 includes a redistribution structure 130 having a first surface 133a and a second surface 133b opposite the first surface 133a, a first semiconductor die 110 coupled to the first surface 133a, and a second semiconductor die 120 coupled to the second surface 133b. As a result, the redistribution structure 130 of the semiconductor device 100 is between the first semiconductor die 110 and the second semiconductor die 120 (collectively "semiconductor dies 110, 120") such that the semiconductor dies 110, 120 act at least generally equally on both sides of the redistribution structure 130 at different temperatures. This is expected to reduce warpage of the semiconductor device 100 compared to existing devices made using Chip First and Chip Last techniques.

The semiconductor dies 110, 120 can each have integrated circuits or components, data storage elements, processing components, and/or other features manufactured on semiconductor substrates. For example, the semiconductor dies 110, 120 can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the semiconductor dies 110, 120 can be identical (e.g., memory dies manufactured to have the same design and specifications), but in other embodiments the semiconductor dies 110, 120 can be different from each other (e.g., different types of memory dies or a combination of controller, logic and/or memory dies).

The first semiconductor die 110 includes bond pads 112 exposed at a front side 113a thereof, and the bond pads 112 are electrically coupled to traces and/or pads at the first surface 133a of the redistribution structure 130 by conductive features 115. The second semiconductor die 120 includes bond pads 122 exposed at a front side 123a thereof, and the bond pads 122 are electrically coupled to traces and/or pads at the second surface 133b of the redistribution structure 130 by conductive features 125. The first and second conductive features 115, 125 (collectively "conductive features 115, 125") can have various suitable structures, such as pillars, columns, studs, bumps, etc., and they can be made from copper, nickel, solder (e.g., SnAg-based solder), conductor-filled epoxy, and/or other electrically conductive materials. In certain embodiments, the first conductive features 115 and/or second conductive features 125 are solder-joints. In selected embodiments, the conductive features 115, 125 can be copper pillars, whereas in other embodiments the conductive features 115, 125 can include more complex structures, such as bump-on-nitride structures. In some embodiments, the first conductive features 115 have a height above the redistribution structure 130 such that the device 100 includes a first gap 118 between the first semiconductor die 110 and the first surface 133a of the redistribution structure 130. Likewise, the second conductive features 125 can have a height above the redistribution structure 130 such that the device 100 includes a second gap 128 between the second semiconductor die 120 and the second surface 133b of the redistribution structure 130. In some embodiments, the volume and/or another quantity or dimension (e.g., height) of the first gap 118 is substantially equal to the volume and/or another quantity or dimension (e.g., height) of the second gap 128.

In the embodiment illustrated in FIG. 1A, the semiconductor dies 110, 120 are coupled to opposing surfaces of the redistribution structure 130 such that they are reflectively symmetric about opposing sides of the redistribution structure 130. In other embodiments, however, the semiconductor dies 110, 120 can have different planform shapes and/or can be arranged differently with respect to the redistribution structure 130 and one another. Moreover, as shown in FIG. 1A, the device 100 includes only two semiconductor dies. However, in other embodiments the device 100 may include any number of semiconductor dies. For example, the device 100 may include one or more additional semiconductor dies stacked on the first semiconductor die 110 and/or second semiconductor die 120, or the device 100 may have other semiconductor dies coupled to the redistribution structure 130 adjacent to the first semiconductor die 110 and/or second semiconductor die 120.

The redistribution structure 130 includes an insulating material 131 and conductive portions 135 electrically isolated from each other by the insulating material 131. The insulating material 131 of the redistribution structure 130 can comprise, for example, one or more layers of a suitable dielectric material (e.g., a passivation material). The conductive portions 135 of the redistribution structure 130 can include first contacts 132 and second contacts 134 (collectively "contacts 132, 134") in and/or on the insulating material 131 and exposed at the first surface 133a. As shown in FIG. 1A, the first contacts 132 can be positioned at the first surface 133a in a die-attach area so that they are at least partially under the first semiconductor die 110. The second contacts 134 can be spaced peripherally away from the first contacts 132 (e.g., fanned laterally outward from or positioned outboard of the first contacts 132) such that they are not positioned under the first semiconductor die 110. The redistribution structure 130 also includes conductive third contacts 136 in and/or on the insulating material 131 and exposed at the second surface 133b. The third contacts 136 can be positioned at the second surface 133b in a die-attach area so that they are at least partially under the second semiconductor die 120 and spaced laterally inward from the second contacts 134.

In some embodiments, at least a portion of the first contacts 132 and third contacts 136 can be vertically aligned (e.g., spaced equally laterally along the redistribution structure 130 and/or reflectively symmetric about the redistribution structure 130). For example, the first contacts 132 can be superimposed directly over/under with respect to the third contacts 136 such that third contacts 136 have the same lateral extent as the first contacts 132. Matching the distribution, size, and/or other characteristics of the first contacts 132 and third contacts 136 can be desirable where the semiconductor dies 110, 120 are the same or have the same configuration of bond pads 112, 122 respectively.

The conductive portions 135 of the redistribution structure 130 can further include conductive lines 138 (e.g., vias and/or traces) extending within and/or on the insulating material 131 to electrically couple individual ones of the first contacts 132 and third contacts 136 to corresponding ones of the second contacts 134. For example, an individual conductive portion 135 can include one or more conductive lines 138 electrically coupling an individual first contact 132 to a corresponding second contact 134 and/or electrically coupling an individual third contact 136 to a corresponding second contact 134. In some embodiments (not illustrated in FIG. 1A), an individual second contact 134 can be electrically coupled, via corresponding conductive lines 138, to more than one first contact 132 and/or third contact 136. In this manner, the device 100 may be configured such that individual pins of the semiconductor dies 110, 120 are individually isolated and accessible (e.g., signal pins) via separate second contacts 134, and/or configured such that multiple pins are collectively accessible via the same second contact 134 (e.g., power supply or ground pins). In certain embodiments, the first contacts 132, second contacts 134, third contacts 136, and conductive lines 138 can be formed from one or more conductive materials such as copper, nickel, solder (e.g., SnAg-based solder), conductor-filled epoxy, and/or other electrically conductive materials.

The redistribution structure 130 does not include a preformed substrate (i.e., a substrate formed apart from a carrier wafer and then subsequently attached to the carrier wafer). As a result the redistribution structure 130 can be very thin. For example, in some embodiments, a distance D between the first and second surfaces 133a and 133b of the redistribution structure 130 is less than 50 µm. In certain embodiments, the distance D is approximately 30 µm, or less than 30 µm. Therefore, the overall size of the semiconductor device 100 can be reduced as compared to, for example, devices including a conventional redistribution layer formed over a pre-formed substrate. However, the thickness of the redistribution structure 130 is not limited. In other embodiments, the redistribution structure 130 can include different features and/or the features can have a different arrangement.

The device 100 also includes conductive columns 140 electrically coupled to the second contacts 134 of the redistribution structure 130. The conductive columns 140 extend away from the first surface 133a of the redistribution structure 130 and can be made from copper, nickel, solder (e.g., SnAg-based solder), conductor-filled epoxy, and/or other electrically conductive materials. In the illustrated embodiment, the conductive columns 140 extend upward above the elevation of a back side 113b of the first semiconductor die 110. That is, the conductive columns 140 can have a height above the first surface 133a of the redistribution structure 130 that is greater than a height of the first semiconductor die 110. In other embodiments, the height of the conductive columns 140 can be equal to, or less than, the height of the back side 113b of the first semiconductor die 110. Accordingly, the height of the conductive columns 140 can be greater than a height of the first conductive features 115 above the first surface 133a of the redistribution structure 130. Moreover, each conductive column 140 can include an exposed terminus 141 (e.g., the end opposite the second contacts 134 of the redistribution structure 130) that defines a conductive fourth contact 142. The fourth contacts 142 can be above, coplanar, or recessed with respect to an upper surface 151 of a first molded material 150.

The first molded material 150 can be formed on at least a portion of the first surface 133a of the redistribution structure 130 and can at least partially surround the first semiconductor die 110 and/or the conductive columns 140. Similarly, a second molded material 160 can be formed on at least a portion of the second surface 133b of the redistribution structure 130 and can at least partially surround the second semiconductor die 120. In some embodiments, the first molded material 150 and the second molded material 160 (collectively "molded materials 150, 160") encapsulate the semiconductor dies 110, 120, respectively, to thereby protect the semiconductor dies 110, 120 from contaminants and physical damage. In certain embodiments, the first molded material 150 at least partially fills the first gap 118 between the front side 113a of the first semiconductor die 110 and the first surface 133a of the redistribution structure 130, and the second molded material 160 at least partially fills the second gap 128 between the front side 123a of the second semiconductor die 120 and the second surface 133b of the redistribution structure 130. In such embodiments, the molded materials 150, 160 can function to strengthen the coupling between the semiconductor dies 110, 120 and the redistribution structure 130.

In the embodiment illustrated in FIG. 1A, the upper surface 151 of the first molded material 150 has a thickness above the redistribution structure 130 (e.g., in a direction away from the first surface 133a) that is greater than a height of the back side 113b of the first semiconductor die 110. Likewise, a lower surface 161 of the second molded material 160 has a thickness below the redistribution structure 130 (e.g., in a direction away from the second surface 133b) that is greater than a height of a back side 123b of the second semiconductor die 120. Forming the molded materials 150, 160 in this manner protects the back sides 113b and 123b of the semiconductor dies 110, 120, respectively, from external contaminants or forces that may damage the dies. In other embodiments, the upper and lower surfaces 151, 161 can be positioned differently with respect to the semiconductor dies 110, 120. For example, the upper and lower surfaces 151, 161 can be coplanar with the back sides 113b, 123b of the semiconductor dies 110, 120, respectively. In such embodiments, the semiconductor dies 110, 120 may contain pads, contacts, or other electrically-connective features at the back sides 113b, 123b such that the semiconductor dies 110, 120 are electrically accessible at the back sides 113b, 123b. In some embodiments, only one of the semiconductor dies 110, 120 is electrically accessible in this manner.

Since the redistribution structure 130 does not include a pre-formed substrate, the molded materials 150, 160 can be configured to provide the desired structural strength to each side of the redistribution structure 130. For example, the molded materials 150, 160 can be selected to prevent the device 100 from bending, warping, etc., as external forces are applied to the device 100. As a result, in some embodiments, the redistribution structure 130 can be made very thin (e.g., less than 50 µm or less than 30 µm) since the redistribution structure 130 need not provide the primary strength of the device 100. Therefore, the overall size (e.g., height) of the device 100 can be reduced.

Additionally, in some embodiments, the first molded material 150 has the same or a substantially equal quantity (e.g., volume), dimension (e.g., height), or material characteristic (e.g., coefficient of thermal expansion) as the second molded material 160. In certain embodiments, the first molded material 150 is the same compound as the second molded material 160, and/or the molded materials 150, 160 are substantially symmetrically formed relative to the redistribution structure 130. Accordingly, the molded materials 150, 160 can strongly influence the overall thermal/mechanical properties of the device 100 to mitigate warpage of the device 100 across a wide range of device temperatures. For example, the volume of the molded materials 150, 160 can be selected so that the average coefficients of thermal expansion for the features (e.g., molded materials, semiconductor dies, conductive columns, additional redistribution structures or conductive features, etc.) on each side of the redistribution structure 130 are substantially equal—even where the semiconductor dies 110, 120 are not identical or arranged to be reflectively symmetric—to inhibit warpage of the device 100.

For example, the ratio of the volume of the first semiconductor die 110 to the volume of the first molded material 150 can be equal to or substantially equal to the ratio of the volume of the second semiconductor die 120 to the volume of the second molded material 160. Similarly, the volume of the molded materials 150, 160 can be adjusted to account for the absence of conductive columns extending from the second surface 133b of the redistribution structure 130. Accordingly, the CTE mismatch between the redistribution structure 130 and the features over the first surface 133a (e.g., the first molded material 150, conductive columns 140, and first semiconductor die 110) can be equal to or substantially equal to the CTE mismatch between the redistribution structure 130 and the features over the second surface 133b (e.g., the second molded material 160 and the second semiconductor die 120). As a result, the thermal stresses induced by the CTE mismatch on each side of the device 100 are countered (e.g., canceled) within the device. This inhibits bending, warping, etc., of the redistribution structure 130 and/or other features of the device 100. Therefore, the overall size (e.g., height) of the redistribution structure 130 can be reduced because the device 100 is configured not to induce substantial (e.g., non-canceled) stresses in the redistribution structure 130 as a result of changing temperatures.

In contrast, conventional "one-sided" semiconductor packages include a redistribution layer ("RDL") with a die attached to only a single side of the RDL, and an encapsulant over that single side. The CTE mismatch between layers (e.g., between the RDL and encapsulant) within such semiconductor packages is not balanced, and the stresses induced by thermal expansion or contraction can cause significant warpage of the semiconductor package which can render the semiconductor package inoperable. For example, semiconductor packages are often exposed to high temperatures when they are incorporated into external circuitry (e.g., during a board mount process). Thus, the board mount process must be modified to use lower temperatures (e.g., at increased cost) or the resulting yield loss from a higher temperature process must be accepted. As compared to conventional "one-sided" semiconductor packages, the present technology is expected to reduce yield loss during other processes involving the semiconductor device 100 and during normal operation, since the semiconductor device 100 is configured for ultra-low warpage over a wide temperature range.

Figure 1B:
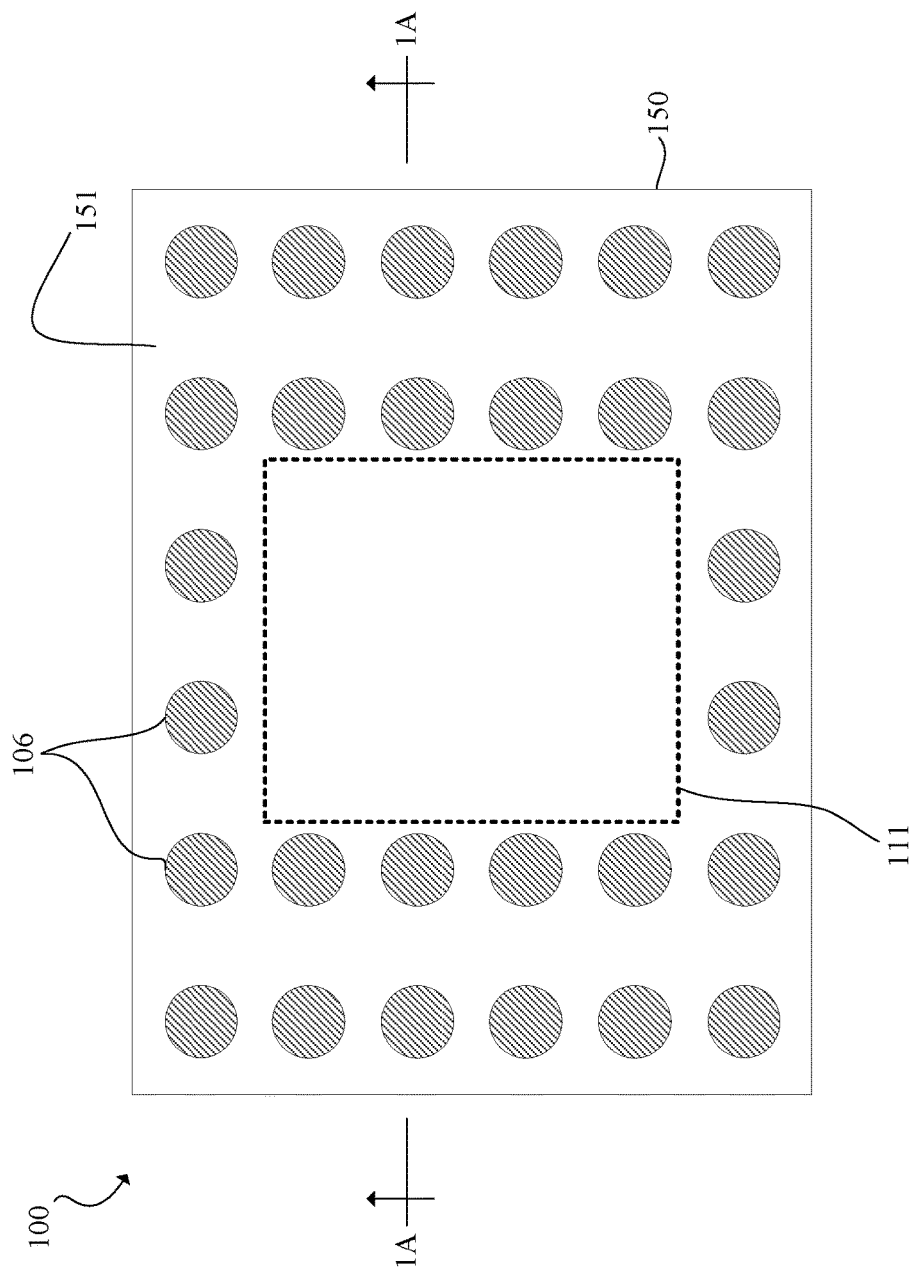

The device 100 can further include electrical connectors 106 disposed on the fourth contacts 142 formed by the conductive columns 140. The electrical connectors 106 can be solder balls, conductive bumps, conductive pillars, conductive epoxies, and/or other suitable electrically conductive elements, and can be electrically coupled to external circuitry (not shown). In some embodiments, the electrical connectors 106 can be generally aligned in rows and columns to form an array (e.g., a ball grid array) on the fourth contacts 142 at the upper surface 151 of the first molded material 150. More specifically, FIG. 1B is a top plan view of the device 100 that schematically shows an embodiment of the arrangment of the electrical connectors 106 on the upper surface 151 of the first molded material 150. In the illustrated embodiment, the electrical connectors 106 are arranged in a perimeter array (e.g., a perimeter ball grid array) in which the electrical connectors 106 are all spaced peripherally away from (e.g., positioned outboard of) the first semiconductor die 110. That is, the electrical connectors 106 are not positioned within a footprint 111 of the first semiconductor die 110.

In other embodiments, one or more of the electrical connectors 106 can be positioned at least partially within the footprint 111 of the first semiconductor die 110, and/or the electrical connectors 106 can have any other suitable positioning and alignment (e.g., in off-set rows or columns, in a concentric pattern, non-evenly spaced, etc.). For example, in some embodiments, a second redistribution structure can be formed on the upper surface 151 of the first molded material 150 and used to distribute the electrical connectors 106 in different arrangements (e.g., a "fanned-in" or other arrangement having greater space between adjacent ones of the electrical connectors 106 than in the perimeter ball grid array embodiment illustrated in FIG. 1B). In other embodiments, the electrical connectors 106 can be omitted and the fourth contacts 142 can be directly connected to external devices or circuitry.

FIGS. 2A-2M are cross-sectional views illustrating various stages in a method of manufacturing semiconductor devices 100 in accordance with embodiments of the present technology. Generally, a semiconductor device 100 can be manufactured, for example, as a discrete device or as part of a larger wafer or panel. In wafer-level or panel-level manufacturing, a larger semiconductor device is formed before being singulated to form a plurality of individual devices. For ease of explanation and understanding, FIGS. 2A-2M illustrate the fabrication of two semiconductor devices 100. However, one skilled in the art will readily understand that the fabrication of semiconductor devices 100 can be scaled to the wafer and/or panel level—that is, to include many more components so as to be capable of being singulated into more than two semiconductor devices 100—while including similar features and using similar processes as described herein.

Figure 2A:
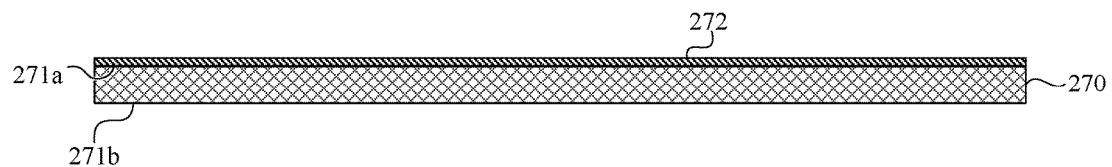
FIGS. 2A-2M are cross-sectional views illustrating a semiconductor device at various stages of manufacturing in accordance with embodiments of the present technology.
Figure 2B:
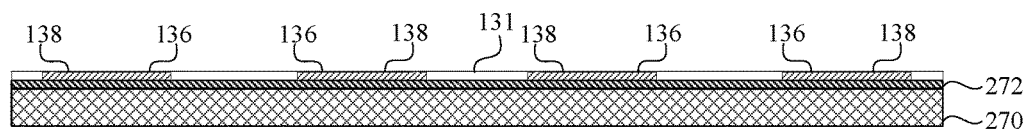

FIGS. 2A-2D, more specifically, show fabricating a redistribution structure for the semiconductor devices 100 (FIG. 1A). Referring to FIG. 2A, the redistribution structure 130 (FIG. 1A) is formed on a first carrier 270 having a front side 271a and a back side 271b, and a first release layer 272 on the front side 271a of the first carrier 270. The first carrier 270 provides mechanical support for subsequent processing stages and can be a temporary carrier formed from, e.g., silicon, silicon-on-insulator, compound semiconductor (e.g., Gallium Nitride), glass, or other suitable materials. In some embodiments, the first carrier 270 can be reused after it is subsequently removed. The first carrier 270 also protects a surface of the first release layer 272 during the subsequent processing stages to ensure that the first release layer 272 can later be properly removed from the redistribution structure 130. The first release layer 272 prevents direct contact of the redistribution structure 130 with the first carrier 270 and therefore protects the redistribution structure 130 from possible contaminants on the first carrier 270. The first release layer 272 can be a disposable film (e.g., a laminate film of epoxy-based material) or other suitable material. In some embodiments, the first release layer 272 is laser-sensitive or photo-sensitive to facilitate its removal at a subsequent stage.

Figure 2C:
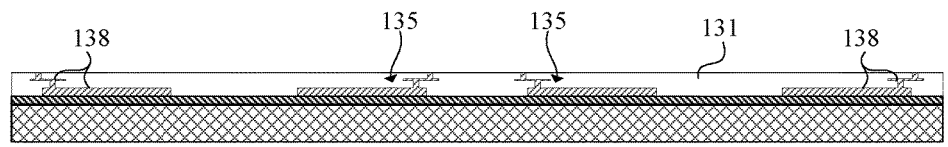

The redistribution structure 130 (FIG. 1A) includes conductive and dielectric materials that can be formed from an additive build-up process. That is, the redistribution structure 130 is additively built directly on the first carrier 270 and the first release layer 272 rather than on another laminate or organic substrate. Specifically, the redistribution structure 130 is fabricated by semiconductor wafer fabrication processes such as sputtering, physical vapor deposition (PVD), electroplating, lithography, etc. For example, referring to FIG. 2B, the third contacts 136 and a portion of the conductive lines 138 can be formed directly on the first release layer 272, and a layer of insulating material 131 can be formed on the first release layer 272 to electrically isolate the individual third contacts 136 and corresponding conductive lines 138. The insulating material 131 may be formed from, for example, parylene, polyimide, low temperature chemical vapor deposition (CVD) materials—such as tetraethylorthosilicate (TEOS), silicon nitride ($Si_3Ni_4$), silicon oxide ($SiO_2$)—and/or other suitable dielectric, non-conductive materials. Referring to FIG. 2C, one or more additional layers of conductive material can be formed to build up the conductive portions 135 on and/or within the insulating material 131, and one or more layers of insulating material can be formed to build up the insulating material 131.

Figure 2D:
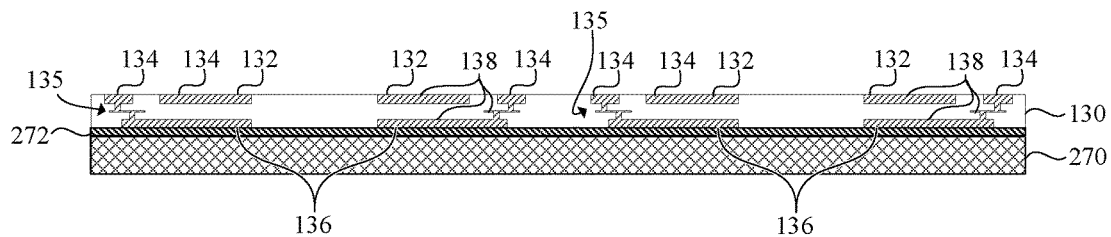

FIG. 2D shows the redistribution structure 130 after being fully formed over the first carrier 270. As described above, the first contacts 132 and third contacts 136 are formed to be electrically coupled to corresponding second contacts 134 via one or more of the conductive lines 138. The conductive portions 135 of the redistribution structure 130 (i.e., the first contacts 132, second contacts 134, third contacts 136, and the conductive lines 138) can be made from copper, nickel, solder (e.g., SnAg-based solder), conductor-filled epoxy, and/or other electrically conductive materials. In some embodiments, the conductive portions 135 are all made from the same conductive material. In other embodiments, the first contacts 132, second contacts 134, third contacts 136, and/or conductive lines 138 can comprise more than one conductive material.

Figure 2E:
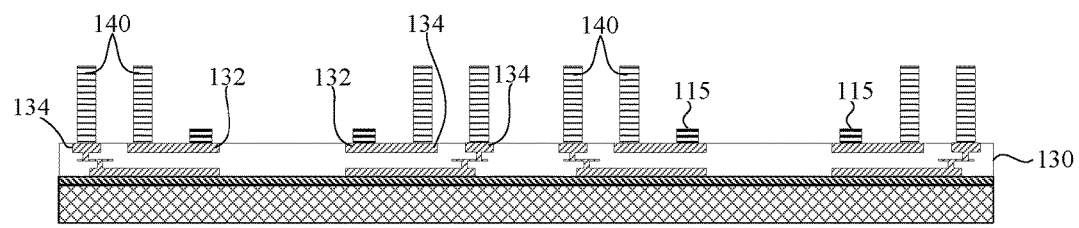

Referring to FIG. 2E, fabrication of the semiconductor devices 100 continues by forming the first conductive features 115 on the first contacts 132 of the redistribution structure 130, and by forming the conductive columns 140 on the second contacts 134 of the redistribution structure 130. In the illustrated embodiment, the conductive columns 140 have a height greater than a height of the first conductive features 115. In some embodiments, the first conductive features 115 and the conductive columns 140 can be formed as part of the same process. For example, in certain embodiments, the first conductive features 115 and conductive columns 140 can be fabricated by a suitable electroplating process, as is well known in the art. In other embodiments, other deposition techniques (e.g., sputter deposition) can be used in lieu of electroplating. In yet other embodiments, the first conductive features 115 and/or conductive columns 140 can be formed from different processes and/or at different times. For example, the first conductive features 115 may comprise solder balls or solder bumps disposed on the first contacts 132, whereas the conductive columns 140 are plated on the second contacts 134 using electroplating or electroless plating techniques. Moreover, the first conductive features 115 and conductive columns 140 can have a circular, rectangular, hexagonal, polygonal, or other cross-sectional shape, and can they be single layer or multi-layer structures.

Figure 2F:
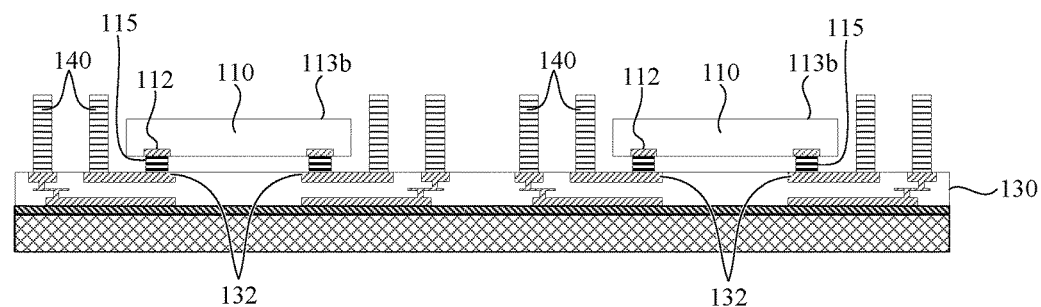

FIG. 2F shows the semiconductor devices 100 after the first semiconductor dies 110 have been electrically coupled to the first conductive features 115. More specifically, the first semiconductor dies 110 can be flip-chipped bonded to the redistribution structure 130 such that the bond pads 112 of the first semiconductor dies 110 are electrically coupled to corresponding ones of the first contacts 132 of the redistribution structure 130 via the first conductive features 115. In some embodiments, the bond pads 112 are coupled to the first conductive features 115 using solder or a solder paste. In other embodiments, another process such as thermo-compression bonding (e.g., copper-copper (Cu—Cu) bonding) can be used to form conductive Cu—Cu joints between the bond pads 112 and the first conductive features 115. As shown in FIG. 2F, the conductive columns 140 can be formed so as to extend past an elevation of a back side 113b of the first semiconductor dies 110. In other embodiments, the conductive columns 140 can be formed to have a height equal to a height of the first semiconductor dies 110 (e.g., upper end portions of the conductive columns 140 can be generally coplanar with the back sides 113b of the first semiconductor dies 110).

Figure 2G:
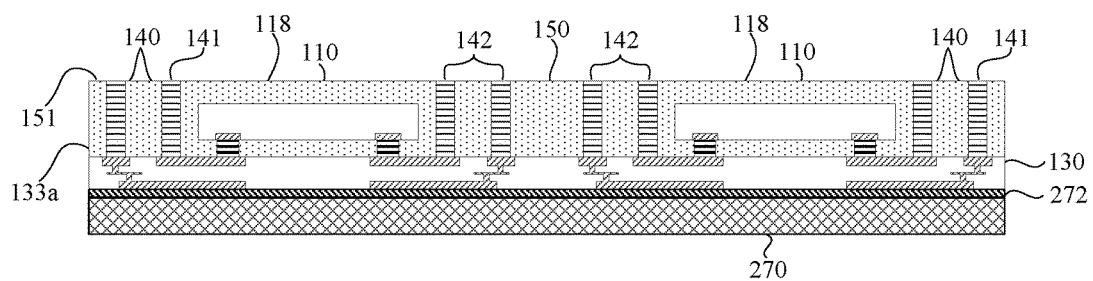

Referring to FIG. 2G, fabrication of the semiconductor devices 100 continues with disposing the first molded material 150 over the first surface 133a of the redistribution structure 130 and at least partially around the first semiconductor dies 110 and conductive columns 140. The first molded material 150 may be formed from a resin, epoxy resin, silicone-based material, polyimide, and/or other suitable resin used or known in the art. Once deposited, the first molded material 150 can be cured by UV light, chemical hardeners, heat, or other suitable curing methods known in the art. The first molded material 150 can be at least partially disposed in the first gap 118 between each first semiconductor die 110 and the first surface 133a of the redistribution structure 130. The first molded material 150 can therefore eliminate the need for a separate underfill material and can strengthen the coupling between the first semiconductor dies 110 and the redistribution structure 130. In an alternative embodiment, the gap 118 can instead be filled with an underfill material and then the first molded material 150 can be disposed over the first surface 133a of the redistribution structure 130. In accordance with one aspect of the present technology, at least the terminus 141 of each conductive column 140 can be exposed at the upper surface 151 of the first molded material 150 such that the termini 141 collectively define the fourth contacts 142. In some embodiments, the first molded material 150 is formed in one step such that the fourth contacts 142 are exposed at the upper surface 151 of the first molded material 150. In other embodiments, the first molded material 150 is formed and then ground back to planarize the upper surface 151 and to thereby expose the fourth contacts 142 of the conductive columns 140. As further shown in FIG. 2G, in some embodiments, the first molded material 150 encapsulates the first semiconductor dies 110 such that the first semiconductor dies 110 are sealed within the first molded material 150.

Figure 2H:
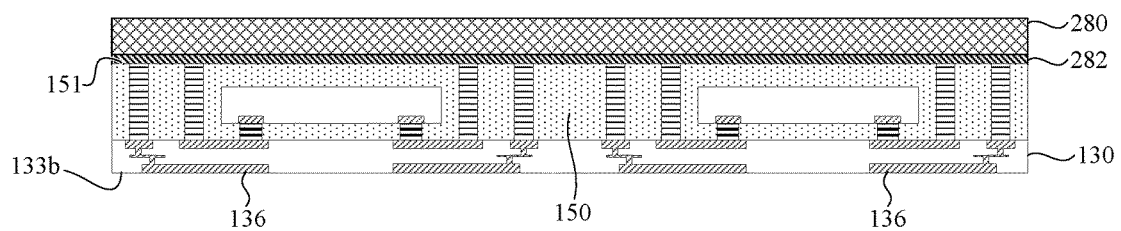

FIG. 2H illustrates the semiconductor devices 100 after the redistribution structure 130 has been separated from the first carrier 270 (FIG. 2G) and the semiconductor device structure has been attached to a second carrier 280. More specifically, the upper surface 151 of the first molded material 150 is attached to a second release layer 282 of the second carrier 280. The second carrier 280 can be a temporary carrier formed from, e.g., silicon, silicon-on-insulator, compound semiconductor (e.g., Gallium Nitride), glass, or other suitable materials and, in part, the second carrier 280 can provide mechanical support for subsequent processing stages on the second surface 133b of the redistribution structure 130. The second release layer 282 can be a disposable film (e.g., a laminate film of epoxy-based material) or other suitable material that secures the second carrier 280 to the molded material 150 and/or other features of the illustrated semiconductor device structure (e.g., the fourth contacts 142 of the conductive columns 140).

In some embodiments, the first release layer 272 (FIG. 2G) allows the first carrier 270 to be easily removed from the redistribution structure 130 via a vacuum, poker pin, laser or other light source, or other suitable method such that the first carrier 270 can be reused again. In other embodiments, the first carrier 270 and first release layer 272 can be removed using grinding techniques (e.g., back grinding) or other suitable techniques such as dry etching processes, chemical etching processes, chemical mechanical polishing (CMP), etc. Removing the first carrier 270 and first release layer 272 exposes the second surface 133b of the redistribution structure 130 including the third contacts 136. In some embodiments, the second carrier 280 is attached before the first carrier 270 is separated from the redistribution structure 130. In other embodiments, the first carrier 270 can be removed before the second carrier 280 is attached. In yet other embodiments, the first molded material 150 can provide enough structural strength such that subsequent processing steps can be carried out without the second carrier 280, and the second carrier 280 can be omitted. Moreover, in the illustrated embodiment, the orientation of the semiconductor device structure does not change (e.g., the second surface 133b of the redistribution structure 130 remains facing downward). However, in some embodiments, the semiconductor device structure may be reoriented before or after attachment of the second carrier 280. For example, the semiconductor device structure can be flipped (e.g., rotated 180°) after attachment of the second carrier 280 (e.g., such that the second surface 133b of the redistribution structure 130 faces upward) to facilitate subsequent processing stages on the second surface 133b.

Figure 2I:
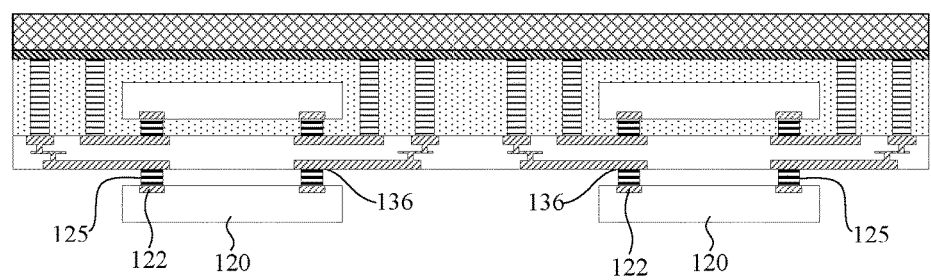

Referring to FIG. 2I, fabrication of the semiconductor devices 100 continues with forming the second conductive features 125 on the third contacts 136 of the redistribution structure 130 and electrically coupling the second semiconductor dies 120 to the second conductive features 125. The second conductive features 125 can be formed as described above with reference to the first conductive features 115. Likewise, the second semiconductor dies 120 can be electrically coupled to the second conductive features 125 in a generally analogous manner to the first semiconductor dies 110, as described above with reference to FIG. 2F. For example, the second conductive features 125 can comprise copper pillars, solder balls, etc., and the second semiconductor dies 120 can be flip-chipped bonded to the redistribution structure 130 such that the bond pads 122 of the second semiconductor dies 120 are electrically coupled to corresponding ones of the third contacts 136 of the redistribution structure 130 via the second conductive features 125. In some embodiments, the semiconductor dies 110, 120 are formed to be symmetric about the redistribution structure 130. For example, the first and second semiconductor dies 110, 120 can be superimposed over/under with respect to each other. In other embodiments, the second semiconductor dies 120 can be electrically coupled to the redistribution structure so as to be laterally offset from the first semiconductor dies 110, and/or the second conductive features 125 can be formed to have a different height than the first conductive features 115.

Figure 2J:
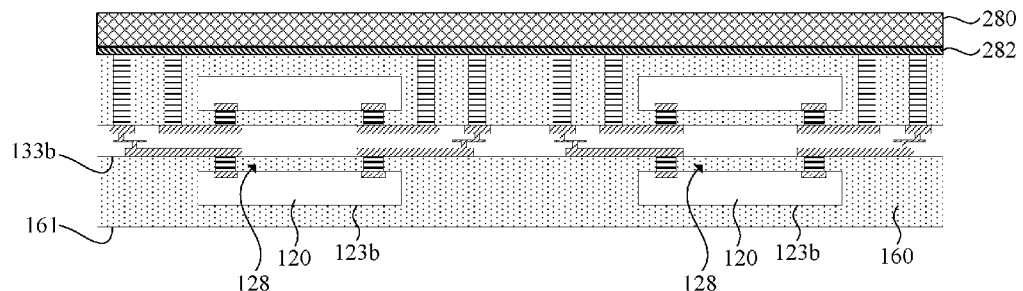

FIG. 2J illustrates the semiconductor devices 100 after the second molded material 160 has been disposed over the second surface 133b of the redistribution structure 130 and at least partially around the second semiconductor dies 120. The second molded material 160 can be generally similar to the first molded material 150 (e.g., may be formed from a resin, epoxy resin, silicone-based material, polyimide, and/or other suitable resin used or known in the art) and can be deposited and cured on the second surface 133b in a generally analogous manner to the first molded material 150, as described above with reference to FIG. 2G. The second molded material 160 can be at least partially disposed in the second gap 128 between each second semiconductor die 120 and the second surface 133b of the redistribution structure 130 to eliminate the need for a separate underfill material and to strengthen the coupling between the second semiconductor dies 120 and the redistribution structure 130. In an alternative embodiment, the gap 128 can first be filled with an underfill material and then the second molded material 160 can be disposed over the second semiconductor die 120.

As further shown in FIG. 2J, in some embodiments, the second molded material 160 encapsulates the second semiconductor dies 120 such that the second semiconductor dies 120 are sealed within the second molded material 160. In some embodiments, the second molded material 160 is formed such that the lower surface 161 is below the redistribution structure 130 (e.g., in a direction away from the second surface 133b) to a greater extent than the back side 123b of the second semiconductor dies 120. In other embodiments, the second molded material 160 can be formed or ground back such that the lower surface 161 is, for example, coplanar with the back sides 123b of the second semiconductor dies 120.

Figure 2K:
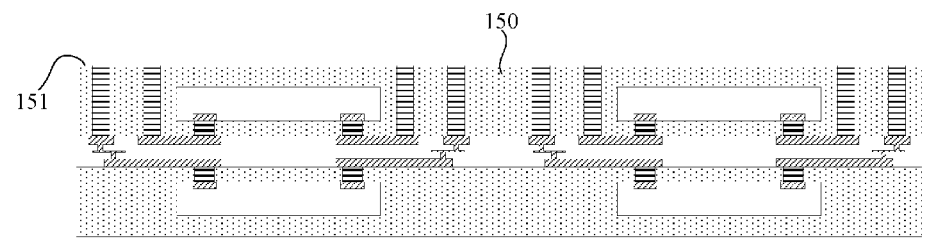

Referring to FIG. 2K, fabrication of the semiconductor devices 100 continues with separating the second carrier 280 (FIG. 2J) from the upper surface 151 of the first molded material 150. The second carrier 280 and second release layer 282 can be separated in a generally similar manner to the first carrier 270 and first release layer 272, as described above with reference to FIG. 2H. For example, the second release layer 282 can allow the second carrier 280 to be easily removed from the first molded material 150 via a vacuum, poker pin, or other suitable method. In other embodiments, the second carrier 280 and second release layer 282 can be removed using other suitable techniques such as, for example, back grinding, dry etching processes, chemical etching processes, chemical mechanical polishing (CMP), etc. Removing the second carrier 280 and second release layer 282 exposes the upper surface 151 of the first molded material 150 and the fourth contacts 142.

Figure 2L:
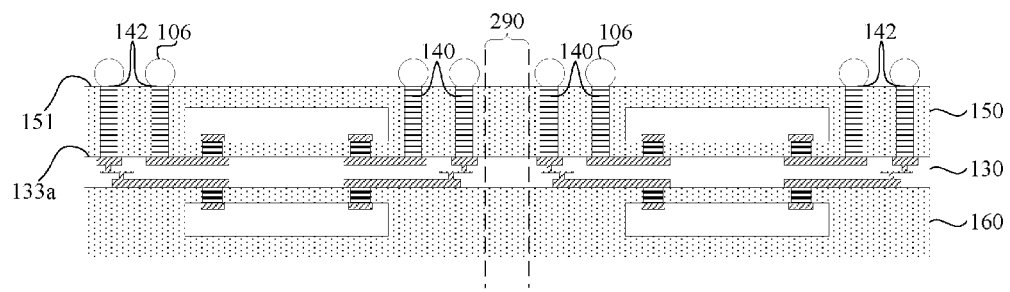

FIG. 2L shows the semiconductor devices 100 after the electrical connectors 106 are coupled to the fourth contacts 142 of the conductive columns 140. The electrical connectors 106 are configured to electrically couple the fourth contacts 142 to external circuitry (not shown). In some embodiments, the electrical connectors 106 comprise solder balls or solder bumps. For example, a stenciling machine can deposit discrete blocks of solder paste onto the fourth contacts 142. The solder paste can then be reflowed to form solder balls or solder bumps on the fourth contacts. In other embodiments, the electrical connectors 106 can be formed before attaching the second carrier 280. For example, in some embodiments, the electrical connectors 106 can be formed after the first molded material 150 is formed on the first surface 133a of the redistribution structure 130 (FIG. 2G) but before the second carrier 280 is attached (FIG. 2H). In such embodiments, the second release layer 282 can be configured to attach the second carrier 280 to the upper surface 151 of the first molded material 150 and/or to the electrical connectors 106. One advantage of forming the electrical connectors 106 at this earlier stage is that the first carrier 270 is still attached and can provide mechanical support for the formation of the electrical connectors 106. However, in the embodiment illustrated in FIG. 2K, the semiconductor device structure—and specifically the molded materials 150, 160—can provide enough structural support without a carrier for forming the electrical connectors 106. Moreover, by forming the electrical connectors 106 at this later stage, the second carrier 280 can be attached to the planar upper surface 151 of the first molded material 150 (FIGS. 2H-2J) without needing to be attached to the electrical connectors 106.

Furthermore, in some embodiments, a second redistribution structure can be formed over the upper surface 151 of the first molded material 150 and the fourth contacts 142 of the conductive columns 140 prior to electrically coupling the electrical connectors 106 (e.g., whether the electrical connectors 106 are formed before the attachment of the second carrier 280 or after the removal thereof). Such a second redistribution structure can be formed by a generally similar process as the redistribution structure 130 (e.g., the second redistribution structure can include conductive and dielectric materials formed from an additive build-up process). The second redistribution structure can provide a different arrangement of contacts than the fourth contacts 142, and the electrical connectors 106 can be formed on the second redistribution structure to provide a different arrangement (e.g., a fanned-in or more widely spaced array) for connecting with external circuitry.

Figure 2M:
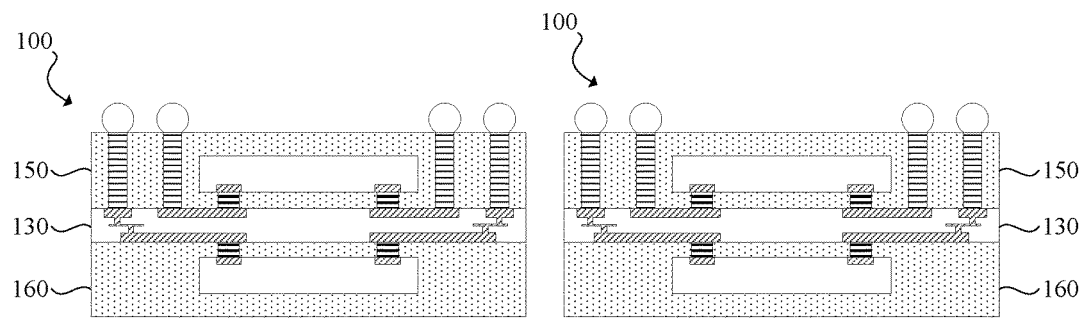

As further shown in FIG. 2L, singulating lanes 290 can be provided between adjacent semiconductor devices 100, to facilitate the singulation thereof. FIG. 2M shows the semiconductor devices 100 after being singulated from one another. Specifically, the first molded material 150, redistribution structure 130, and second molded material 160 can be cut together at the singulating lanes 290 (illustrated in FIG. 2L) to separate the semiconductor devices 100 from one another. Once singulated, the individual semiconductor devices 100 can be attached to external circuitry via the electrical connectors 106 and thus incorporated into a myriad of systems and/or devices.

Figure 3:
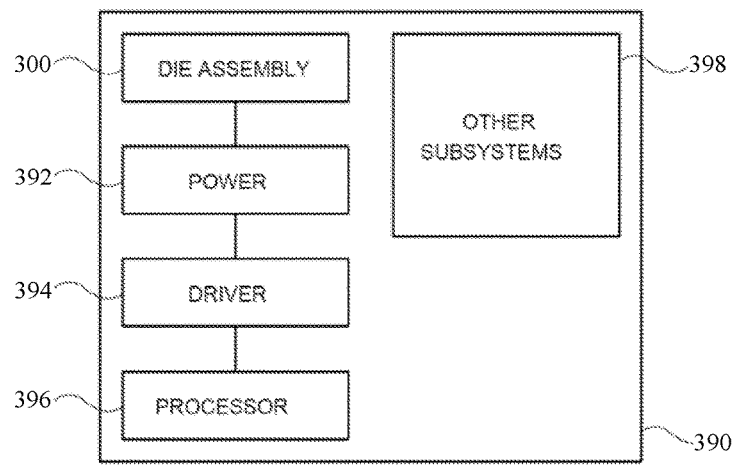
FIG. 3 is a schematic view of a system that includes a semiconductor device configured in accordance with embodiments of the present technology.

Any one of the semiconductor devices described above with reference to FIGS. 1-2M can be incorporated into any of a myriad of larger and/or more complex systems, a representative example of which is system 390 shown schematically in FIG. 3. The system 390 can include a semiconductor die assembly 300, a power source 392, a driver 394, a processor 396, and/or other subsystems or components 398. The semiconductor die assembly 300 can include semiconductor devices with features generally similar to those of the semiconductor devices described above. The resulting system 390 can perform any of a wide variety of functions, such as memory storage, data processing, and/or other suitable functions. Accordingly, representative systems 390 can include, without limitation, hand-held devices (e.g., mobile phones, tablets, digital readers, and digital audio players), computers, and appliances. Components of the system 390 may be housed in a single unit or distributed over multiple, interconnected units (e.g., through a communications network). The components of the system 390 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
    a redistribution structure having a first surface and a second surface opposite the first surface, wherein the first surface includes first conductive contacts and second conductive contacts, wherein the second surface includes third conductive contacts, and wherein the first conductive contacts and third conductive contacts are electrically coupled to corresponding ones of the second conductive contacts by conductive lines extending through and/or on an insulating material;
    a first semiconductor die at the first surface of the redistribution structure and electrically coupled to the first conductive contacts, wherein at least a first one of the second contacts is spaced laterally farther from the first semiconductor die than the corresponding first contact to which the first one of the second contacts is electrically coupled;
    a second semiconductor die at the second surface of the redistribution structure and electrically coupled to the third conductive contacts, wherein at least a second one of the second contacts is spaced laterally farther from the second semiconductor die than the corresponding third contact to which the second one of the second contacts is electrically coupled;
    a first molded material on the first surface that at least partially encapsulates the first semiconductor die;
    a second molded material on the second surface that at least partially encapsulates the second semiconductor die; and
    conductive columns extending through the first molded material and electrically coupled to corresponding ones of the second conductive contacts.

2. The semiconductor device of claim 1 wherein the first and second semiconductor dies are reflectively symmetric about the redistribution structure.

3. The semiconductor device of claim 1 wherein the first molded material is the same as the second molded material.

4. The semiconductor device of claim 1 wherein a coefficient of thermal expansion of the first molded material is substantially equal to a coefficient of thermal expansion of the second molded material.

5. The semiconductor device of claim 1 wherein a volume of the first molded material is substantially equal to a volume of the second molded material.

6. The semiconductor device of claim 1 wherein the conductive columns have a height at least as great as the distance between an uppermost surface of the first semiconductor die and the first surface of the redistribution structure.

7. The semiconductor device of claim 1 wherein the conductive columns each have an end portion exposed from the first molded material and the end portions collectively define fourth conductive contacts.

8. The semiconductor device of claim 7, further comprising conductive features disposed on the fourth conductive contacts.

9. The semiconductor device of claim 8 wherein the conductive features are at least one of solder balls and solder bumps.

10. The semiconductor device of claim 1 wherein a thickness of the redistribution structure between the first and second surfaces is less than about 50 μm.

11. The semiconductor device of claim 1 wherein the redistribution structure is a first redistribution structure, and further comprising a second redistribution structure on at least a portion of the first molded material.

12. The semiconductor device of claim 1 wherein the redistribution structure does not include a pre-formed substrate.

13. A semiconductor device, comprising:
    a redistribution structure having a first surface and a second surface opposite the first surface, wherein the first surface includes first conductive contacts and second conductive contacts, wherein the second surface includes third conductive contacts, and wherein the first conductive contacts and third conductive contacts are electrically coupled to corresponding ones of the second conductive contacts by conductive lines extending through and/or on an insulating material;
    a first semiconductor die at the first surface of the redistribution structure and electrically coupled to the first conductive contacts;
    a second semiconductor die at the second surface of the redistribution structure and electrically coupled to the third conductive contacts;

a first molded material on the first surface, wherein the first molded material completely encapsulates the first semiconductor die;
a second molded material on the second surface, wherein the second molded material completely encapsulates the second semiconductor die; and
conductive columns extending through the first molded material and electrically coupled to corresponding ones of the second conductive contacts.

14. A semiconductor device, comprising:
a redistribution structure having a first surface and a second surface opposite the first surface, wherein the first surface includes first conductive contacts and second conductive contacts, wherein the second surface includes third conductive contacts, and wherein the first conductive contacts and third conductive contacts are electrically coupled to corresponding ones of the second conductive contacts by conductive lines extending through and/or on an insulating material;
a first semiconductor die at the first surface of the redistribution structure and electrically coupled to the first conductive contacts, wherein the first surface includes a first die-attach area under the first semiconductor die, wherein the first conductive contacts are in the first die-attach area, and wherein the second conductive contacts are outside of the first die-attach area;
a second semiconductor die at the second surface of the redistribution structure and electrically coupled to the third conductive contacts, wherein the second surface includes a second die attach area under the second semiconductor die, and wherein the third conductive contacts are in the second die attach area;
a first molded material on the first surface that at least partially encapsulates the first semiconductor die;
a second molded material on the second surface that at least partially encapsulates the second semiconductor die; and
conductive columns extending through the first molded material and electrically coupled to corresponding ones of the second conductive contacts.

15. A semiconductor device package, comprising:
a redistribution structure having a first side, a second side, and conductive pathways extending through and/or on an insulating material, wherein the insulating material electrically isolates the conductive pathways;
conductive columns extending away from the first side of the redistribution structure and electrically coupled to corresponding ones of the conductive pathways;
a first semiconductor die attached to the first side of the redistribution structure and electrically coupled to a first portion of the conductive columns via a first portion of the conductive pathways, wherein the first semiconductor die has first bond pads that face the first side of the redistribution structure;
a second semiconductor die attached to the second side of the redistribution structure and electrically coupled to a second portion of the conductive columns via a second portion of the conductive pathways, wherein the second semiconductor die has second bond pads that face the second side of the redistribution structure;
first conductive features disposed on the redistribution structure and electrically coupled to corresponding ones of the first bond pads;
second conductive features disposed on the redistribution structure and electrically coupled to corresponding ones of the second bond pads; and
a molded material on the first side and second side of the redistribution structure, wherein the molded material at least partially surrounds the first semiconductor die, the second semiconductor die, and the conductive columns, and wherein a portion of each conductive column is exposed from the first molded material to collectively define conductive package contacts.

16. The semiconductor device package of claim 15 wherein at least one of the package contacts is electrically coupled to both the first semiconductor die and the second semiconductor die.

17. The semiconductor device package of claim 15 wherein the molded material on the first side has a first dimension, wherein the molded material on the second side has a second dimension, and wherein the molded material is configured such that, in response to a change in a temperature of the semiconductor device package, the first dimension and second dimension change at an equal or substantially equal rate.

18. The semiconductor device package of claim 15 wherein the first and second conductive features are at least one of copper pillars or a solder material.

* * * * *